US010750634B2

(12) United States Patent
Lee

(10) Patent No.: US 10,750,634 B2
(45) Date of Patent: Aug. 18, 2020

(54) RACKMOUNT SERVER SYSTEM AND METHOD FOR CONTROLLING SAME

(71) Applicant: DOBE COMPUTING CO., LTD., Yongin-si (KR)

(72) Inventor: Sung Kyun Lee, Yongin-si (KR)

(73) Assignee: DOBE COMPUTING CO., LTD., Yongin-si (KR)

( * ) Notice: Subject to any disclaimer, the term of this patent is extended or adjusted under 35 U.S.C. 154(b) by 0 days.

(21) Appl. No.: 15/521,453

(22) PCT Filed: Oct. 26, 2015

(86) PCT No.: PCT/KR2015/011296
§ 371 (c)(1),
(2) Date: Apr. 24, 2017

(87) PCT Pub. No.: WO2016/068552
PCT Pub. Date: May 6, 2016

(65) Prior Publication Data
US 2017/0325354 A1 Nov. 9, 2017

(30) Foreign Application Priority Data
Oct. 27, 2014 (KR) ........................ 10-2014-0145685

(51) Int. Cl.
*H05K 7/20* (2006.01)
*H05K 7/18* (2006.01)
*H05K 5/02* (2006.01)

(52) U.S. Cl.
CPC ............ *H05K 7/18* (2013.01); *H05K 5/0213* (2013.01); *H05K 7/20145* (2013.01);
(Continued)

(58) Field of Classification Search
CPC .. H05K 7/20; H05K 7/20009; H05K 7/20136; H05K 7/20536; H05K 7/20554;
(Continued)

(56) References Cited

U.S. PATENT DOCUMENTS 5,803,165 A * 9/1998 Shikazono .............. F28F 1/124
165/133
9,395,974 B1 * 7/2016 Eichelberg ................ G06F 8/65
(Continued)

FOREIGN PATENT DOCUMENTS

JP 06097338 4/1994
JP 2004063755 2/2004
(Continued)

OTHER PUBLICATIONS

International Search Report—PCT/KR2015/011296 dated Mar. 28, 2016.

*Primary Examiner* — Anatoly Vortman
*Assistant Examiner* — Zhengfu J Feng
(74) *Attorney, Agent, or Firm* — Cantor Colburn LLP

(57) ABSTRACT

Provided are a rack mount server system, which has no damage to computation equipment even if a disorder occurs in a cooling device, which is easy to maintain, minimize power consumption, which has a simple structure, and which performs an efficient cooling, and a control method thereof. The system comprises: a rack housing; and a cooling zone which is placed in the rack housing, which stores a server, and which is forcibly cooled. The rack housing comprises a heat exchanger and an evaporator, which cool the cooling zone. The cooling methods of the cooling structure may be different in accordance with the internal temperature of the cooling zone and the external temperature of the cooling zone.

17 Claims, 14 Drawing Sheets

(52) U.S. Cl.
CPC ..... H05K 7/20172 (2013.01); H05K 7/20209 (2013.01); H05K 7/20754 (2013.01); H05K 7/20818 (2013.01)

(58) Field of Classification Search
CPC ........... H05K 7/20563; H05K 7/20572; H05K 7/20581; H05K 7/2059; H05K 7/206; H05K 7/20609; H05K 7/20709; H05K 7/20727; H05K 7/20736; H05K 7/20745; H05K 7/20754
USPC .................................................. 361/679.46
See application file for complete search history.

(56) References Cited

U.S. PATENT DOCUMENTS

| | | | |
|---|---|---|---|
| 9,398,731 B1 * | 7/2016 | Imwalle | H05K 7/20781 |
| 2003/0094266 A1 * | 5/2003 | Fritsch | H02B 1/565 |
| | | | 165/135 |
| 2005/0168938 A1 * | 8/2005 | Bash | G06F 1/20 |
| | | | 361/679.48 |
| 2010/0139887 A1 * | 6/2010 | Slessman | F28F 9/0265 |
| | | | 165/67 |
| 2013/0000336 A1 * | 1/2013 | Hagiwara | F25D 31/005 |
| | | | 62/159 |
| 2013/0233532 A1 * | 9/2013 | Imwalle | F28F 27/02 |
| | | | 165/287 |
| 2013/0288588 A1 * | 10/2013 | Shih | G06F 1/206 |
| | | | 454/256 |
| 2014/0250956 A1 * | 9/2014 | Chong | G07C 9/00174 |
| | | | 70/278.1 |
| 2015/0000317 A1 * | 1/2015 | Murakami | F25B 1/005 |
| | | | 62/190 |
| 2015/0062806 A1 * | 3/2015 | Shelnutt | H05K 7/203 |
| | | | 361/679.53 |

FOREIGN PATENT DOCUMENTS

| | | | |
|---|---|---|---|
| JP | 2004246649 | | 9/2004 |
| JP | 2004363308 A | * | 12/2004 |
| KR | 101132808 | | 4/2012 |
| KR | 20120072863 | | 7/2012 |
| KR | 20120072880 | | 7/2012 |
| KR | 20130080612 | | 7/2013 |

* cited by examiner

RACKMOUNT SERVER SYSTEM AND METHOD FOR CONTROLLING SAME

TECHNICAL FIELD

The present invention relates to a rack mount server system and a control method thereof, and more specifically, to a server system, which has a heat exchanger and an evaporator installed on a rack and which cools a server inside the rack by air circulation, and a control method thereof.

BACKGROUND ART

Recently, a rack mount method is the major trend in system composition, storage, and installation of information processing devices such as a server. The rack mount method is to mount devices with various functions on a rack, which fits a specific norm, by multiple layers. The system is able to freely select and place each device, to have excellent flexibility and expandability in system composition, and to reduce the area occupied by the whole system. Meanwhile, in relation to servers, a 19-inch rack specified by the International Electrical Commission (IEC) norm and the Electrical Industries Association (EIA) norm is the major trend. The 19-inch rack is specified to have a horizontal width of 451 mm of a supporter pillar for mounting devices and a height of 1 U (IEIA)=44.45 mm.

A rack mount server system is required to be able to cool down for effectively remove the heat generated in the server. In relation to the cooling technology of the rack mount server system, Japanese Publicized Patent No. 2004-246649 presents a cooling structure which cools with a liquid. Japanese Publicized Patent No. 2004-063755 provides a cooling structure which supplies cold air from an air-conditioning unit to an air inlet on the bottom of a rack, cools the devices in the rack with the cold air, and circulates the air by returning the heated air discharged from an air outlet on the top of the rack to the air-conditioning unit.

The rack mount server system having the above conventional rack cooling structure operates only a single cooling cycle. However, the cooling structure, in case of a disorder in the cooling device, has many issues such as a malfunction or maloperation of expensive computation equipment and an increase in power consumption. The conventional cooling structure is complex, making it difficult to manufacture and maintain it. Meanwhile, the rack mount server system must perform an efficient cooling in accordance with changes in temperatures. Here, an efficient cooling means optimize power consumption and cooling efficiency by considering the relations between the internal temperature of the server system and the external temperature. But, the conventional server system is not able to realize precise cooling in accordance with the internal temperature and the external temperature.

DETAILED DESCRIPTION OF THE INVENTION

Technical Problem

The present invention aims to provide a rack mount server system, which has no damage to computation equipment even if a disorder occurs in a cooling device, which is easy to maintain, and minimize power consumption, which has a simple structure, and that performs an efficient cooling, and a control method thereof.

Solution to Problem

To achieve this purpose, the rack mount server system of the present invention comprises: a rack housing; and a cooling zone which is placed in the rack housing, which stores a server, and which is forcibly cooled. Here, the rack housing comprises: a heat exchanger; an evaporator; and a cooling structure which operates one or more of the heat exchanger and the evaporator in order to cool the cooling zone.

In the server system of the present invention, the heat exchanger and the evaporator are successively placed and may be placed on one or more places of the top, the bottom, and a side surface of the cooling zone. The heat exchanger and the evaporator may be separated and respectively placed on the top and the bottom of the cooling zone. The evaporator may comprise one or more evaporator units. The rack housing comprises: a front door and a rear door, which open/close the cooling zone; and side surface panels on the left and the right. The side surface panels on the left and the right, the front door, and the rear door may be sealed by a gasket. The rack housing may comprise a door sensor which, when one or more of the front door and the rear door are opened, stops the operation of the evaporator.

In a desirable system of the present invention, the rack housing may comprise a tank-shaped suction tank which sucks up the air in the cooling zone. The inside of the suction tank may have a suction connection unit inserted, which has a packing. The rack housing may have a cable bin which has a cable insertion hole through which a cable is inserted into the cooling zone.

In a desirable system of the present invention, the heat exchanger may comprise: a plurality of radiation fins in which the air from the cooling zone flows; and a heat exchange pipe which comes in contact with the radiation fins physically and in which the air outside the rack housing flows. The heat exchange pipe may have a curved unit inside or may be in the shape of a wave. The radiation fins may be extended straight or may be in the shape of a wave, while keeping a regular distance between the radiation fins. The evaporator may exchange heat by liquid evaporation or may exchange heat by a refrigerant which flows in a refrigerant flow path in a chiller.

In a desirable enablement of the present invention, the server system may comprise n units (n is a whole number) of cooling structures which comprise: the heat exchanger; and the evaporator, and may comprise (n+1) units of the cooling zones which are combined with both sides of the cooling structures and which are cooled. The server system may have a duct for external air, which is attached to the cooling structures, and the rack housing may have a pressure control means attached, which controls the air pressure by the external air. The cooling structures and the rack housing are detachable.

In the rack mount server system of the present invention, a compressor and a condenser, which are connected to the evaporator, may be placed outside the rack mount server system. The compressor and the condenser, which are mounted in the cooling structures and which are connected to the evaporator, may discharge heat generated in the compressor and the condenser to the outside by a duct.

To achieve the purpose of the present invention, the control method of the rack mount server system may comprise: a heat exchanger and an evaporator, which are placed in a rack housing; and a cooling structure which stores a server, and which operates one or more of the heat exchanger and the evaporator in order to forcibly cool a cooling zone, and may use different cooling methods of the cooling structure in accordance with the internal temperature of the cooling zone and the external temperature of the cooling zone.

In the control method of the present invention, when the external temperature is higher than the internal temperature, the operation of the heat exchanger may be stopped. When the external temperature is lower than the internal temperature and the internal temperature is higher than a threshold temperature (T1) and is lower than another threshold temperature (T2), only the heat exchanger may be operated. When the external temperature is lower than the internal temperature and the internal temperature is the same as or higher than the other threshold temperature (T2) and is lower than another threshold temperature (T3), a primary cooling may be done by the heat exchanger and a secondary cooling may be done by the evaporator. When the internal temperature is higher than the other threshold temperature (T3), the front door and the rear door of the rack housing may be opened.

Advantageous Effects of Invention

According to the rack mount server system and the control method thereof of the present invention, since the system has a heat exchanger and an evaporator, which operate differently from each other in accordance with a threshold temperature: no damage is given to computation equipment even if a disorder occurs in a cooling device; it is easy to maintain; power consumption is minimized; the structure is simple; and an efficient cooling can be done. In addition, the capacity of the heat exchanger and the evaporator may be made greater by placing the heat exchanger and the evaporator on both sides of the cooling zone, and may be applied to a multiple rack mount server system by placing the heat exchanger and the evaporator on a side surface. Further, power consumption may be reduced and cooling efficiency may be optimized to meet the circumstances by controlling the primary cooling and the secondary cooling in accordance with a threshold temperature.

BEST MODE FOR ENABLEMENT OF THE INVENTION

Below provided is a detailed description of a desirable enablement of the present invention by referring to the attached drawings. The enablement described below may be transformed into various other modes, and the scope of the present invention is not limited to the enablement described below. The enablement of the present invention is provided to more completely describe the present invention to those who have ordinary skill in the art to which the present invention pertains.

The enablement of the present invention presents a rack mount server system, which comprises a heat exchanger and an evaporator, which differently operate from each other in accordance with a threshold temperature, which has no damage to computation equipment even if a disorder occurs in a cooling device, which is easy to maintain, and minimize power consumption, which has a simple structure, and that performs an efficient cooling, and a control method thereof. To achieve this purpose, here specifically examined is the rack mount server system with a cooling structure, in which a heat exchanger and an evaporator are mounted, and provided is a detailed description of the process in which the server system is efficiently cooled by the cooling structure. Here, the cooling structure comprises not only the heat exchanger and the evaporator but also all other elements which operate the heat exchanger and the evaporator.

Figure 1:
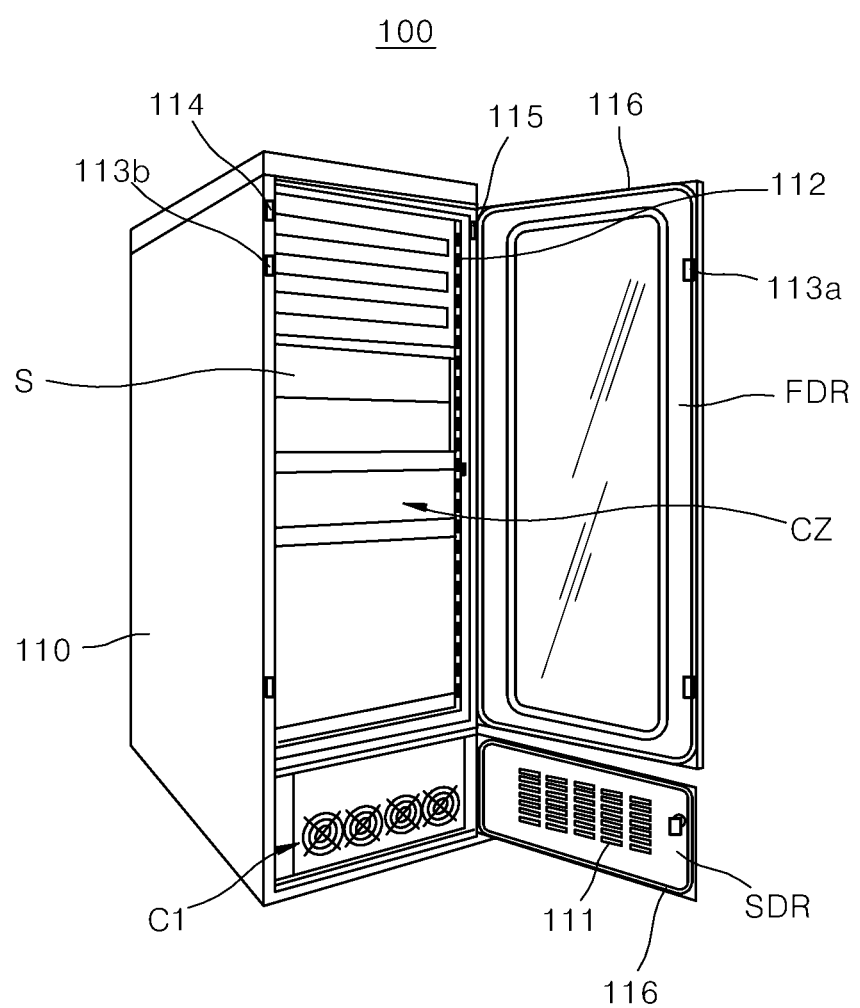
FIG. 1 is a perspective view which shows a first rack mount server system according to the present invention.

FIG. 1 is perspective view which shows a first rack mount server system (100) according to an enablement of the present invention.

According to FIG. 1, the first system (100) comprises: a rack housing (110) which stores a server (S) inside; and a first cooling structure (C1) which is installed on one place of the top and the bottom of the rack housing (110). On the rack housing (110) installed are a front door (FDR) and a rear door (RDR, refer to FIG. 2), which rotate around a hinge shaft. The doors (FDR, RDR) are made from transparent materials, for instance, glass, and a user can see the inside with the naked eye. On each edge in the rack housing (110) placed are a plurality of mount racks (112) which are vertical to the ground surface. On the mount racks (112) settled is each edge of the server (S). On the mount racks (112) installed are computation equipment such as the server (S), and the mount racks compose a 19- or 23-inch standard rack specified by international norms (IEC, EIA, DIN). The rack housing (110) seals a rectangular parallelepiped indoor space divided by the mount racks (112), and forms the exterior of the first system (100) of the present invention. The space, in which the server (S) may be stored by the mount racks (112), is called a cooling zone (CZ).

Each of the doors (FDR, RDR) has a lock unit (113a) for sealing, and the rack housing (110) also has a lock unit (113b) which corresponds to the lock unit (113a). The lock units (113a, 113b) may use a variety of methods, but what is desirable is an electromagnetic lock which operates by an electromagnetic force. Each of the doors (FDR, RDR) has an open unit (115) such as a plunger. The plunger is to open the doors by elastic force of a spring. The plunger, when the temperature is the same as or higher than a threshold temperature (T3), which will be described later, stops a signal of the electromagnetic lock. Here, the electromagnetic lock is desirable to operate only when the password is entered or when the temperature is the same as or higher than the threshold temperature (T3).

A door sensor (114) may be attached to the rack housing (110). The door sensor (114), when one or more doors of the doors (FDR, RDR) are opened, stops the operation of the evaporator mounted in a first cooling structure (C1). If the evaporator continues to operate with the door open, the humidity in the rack housing (110) may be rapidly increased by the evaporator. The door sensor (114) is to prevent a rapid increase in the humidity.

The first system (100) of the present invention may seal the cooling zone (CZ) by having a gasket (116) in the side surface panels on the left and the right and the doors (FDR, RDR). When the cooling zone (CZ) is sealed, noise may be prevented from being discharged to the outside, and dust or the like may be prevented from being put in from outside. The first cooling structure (C1) has not only the heat exchanger and the evaporator of the first system (100) of the present invention but also all elements for operating the heat exchanger and the evaporator. This will be described in detail later. The first cooling structure (C1) is opened by a subsidiary door (SDR), and the subsidiary door (SDR) has a plurality of penetrating vent holes (111) through which external air may enter and exit.

Figure 2:
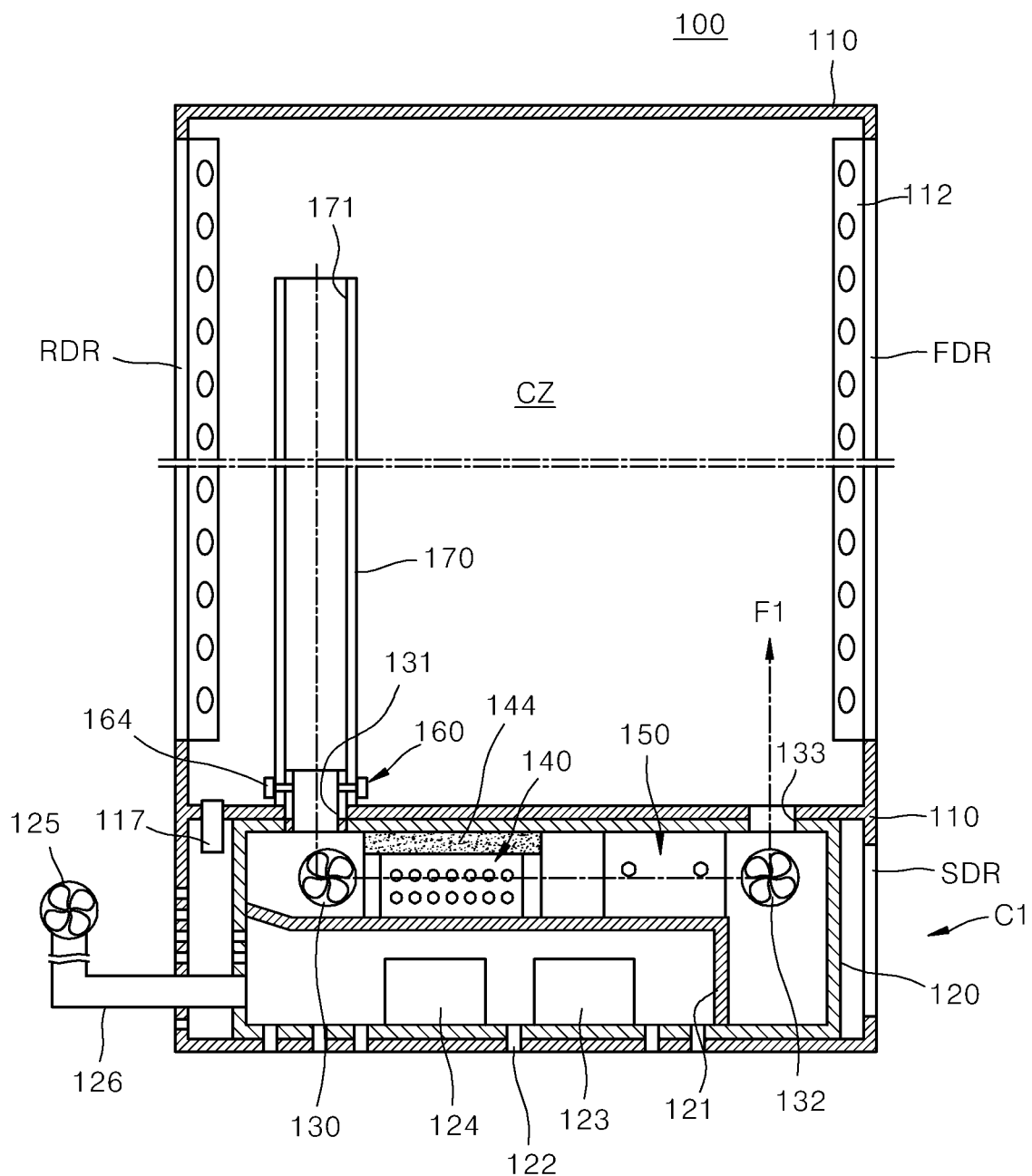
FIG. 2 is a cross-sectional drawing which describes the first rack mount server system according to the present invention.
Figure 3:
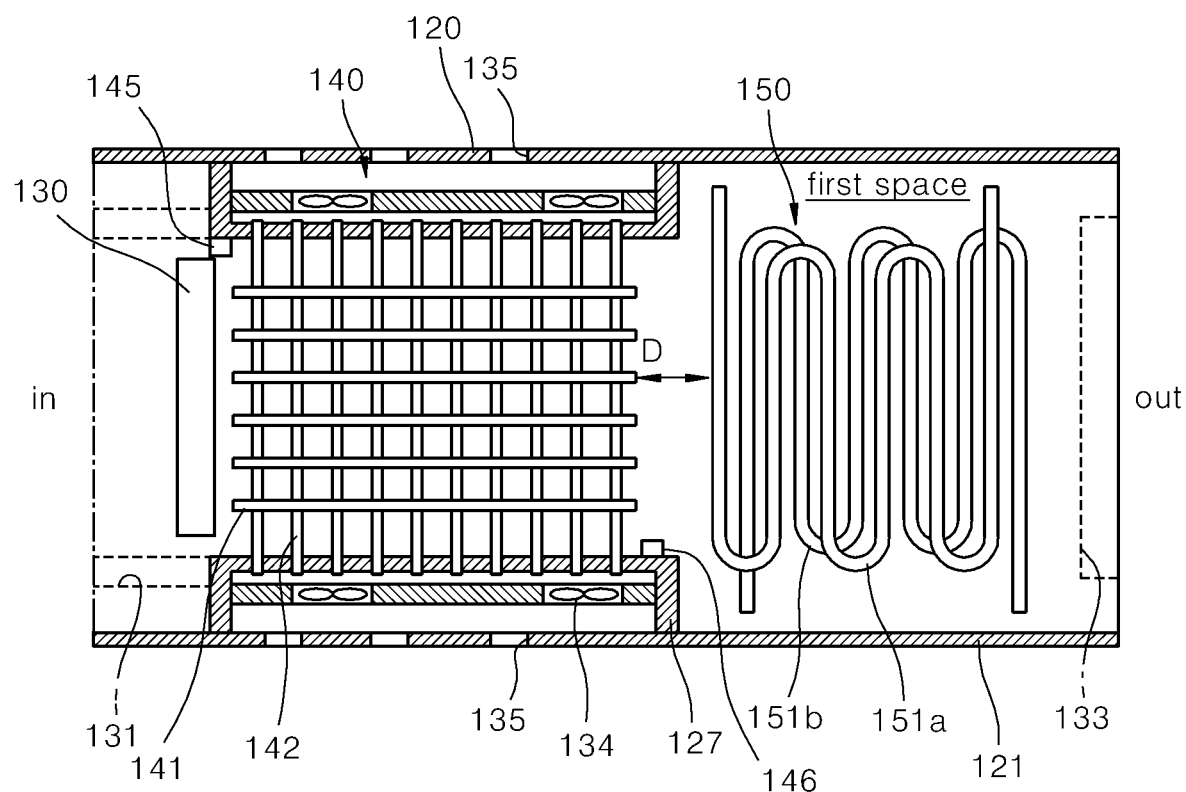
FIG. 3 is a ground plan which specifically expresses the heat exchanger and the evaporator of FIG. 2.

FIG. 2 is a cross-sectional drawing which describes the first rack mount server system (100) according to an enablement of the present invention. FIG. 3 is a ground plan which specifically expresses the heat exchanger (140) and the evaporator (150) of FIG. 2.

According to FIG. 2, the first system (100) is divided into the cooling zone (CZ), which is opened and closed by the front door (FDR) and the rear door (RDR), and the first cooling structure (C1), which is opened and closed by the subsidiary door (SDR). The first cooling structure (C1) may exist on the top or the bottom of the cooling zone (CZ), but is more desirable to be on the bottom if cooling efficiency is considered. The first cooling structure (C1) is built in a first case (120) which accommodates the first cooling structure (C1). The inside of the first case (120) is divided into a first space, which has the heat exchanger (140) and the evaporator (150), and a second space which has a compressor (123) and a condenser (124), which operate the evaporator (150). The first space and the second space are separated from each other by a first partition wall (121) in order to prevent heat in the second space from penetrating into the first space. As the case may be, the first partition wall (121) may be insulated. The rack housing (110) has a plurality of vent holes (122) to discharge heat in the second space to the outside.

The first space sucks up the internal air in the cooling zone (CZ), which is heated by heat of the server (S). After that, the first space cools the heated internal air, and then transfers the cooled air back to the cooling zone (CZ). The internal air is sucked up through a suction hole (171) which is formed on one or more suction tanks (170) which are vertical to the cooling zone (CZ). The inside of the suction tanks (170) is empty, and the height and the number of the suction tanks (170) may be set by considering the size of the cooling zone (CZ), the flow of the internal air, etc. The suction tanks (170) are fixated on the rack housing (110), and is connected to the first space of the first case (120) by a suction connection unit (160). The suction connection unit (160) is fixated on the suction tanks (170) by using a tightening bolt (164). This will be described in detail in FIG. 6.

Meanwhile, the first system (100) of the present invention may seal the part, on which a cable is inserted into the cooling zone (CZ), in order to let the air in the cooling zone (CZ) flow only to the first cooling structure (C1). The cable may include a power line, communication line, and a variety of signal lines. A cable bin (117) seals the cooling zone (CZ) without being influenced by the insertion of the cable. This will be examined in detail later. The position of the cable bin (117) may be determined by considering the size of the first system (100), etc. The cable bin (117) prevents external air from flowing into the cooling zone (CZ) of the present invention. When the doors (FDR, RDR) are closed, the cable bin (117) prevents external air from flowing in, together with the gasket (116 in FIG. 1) of the doors (FDR, RDR). When air is prevented from flowing in as above, the air in the cooling zone (CZ) only passes through the first cooling structure (C1) which has the heat exchanger (140) and the evaporator (150).

A first fan (130) sucks up the air in the cooling zone (CZ), which is inserted from the suction tanks (170), through a first penetrating hole (131). A second fan (132) sends the air, which has passed through the heat exchanger (140) and the evaporator (150), to the cooling zone (CZ) through a second penetrating hole (133). The first penetrating hole (131) sucks up the air from the cooling zone (CZ), and the second penetrating hole (133) discharges the air to the cooling zone (CZ). The air flow following this process is displayed as F1. The first penetrating hole (131) is formed by fitting the suction tanks (170), and may have a diameter which is similar to the diameter of the suction tanks (170). The second penetrating hole (133) may have a diameter which is similar to the width of the server (S), in order to let the cooled air be evenly supplied to the whole server (S). The capacity of the first fan and the second fan (130, 132) is desirable to be greater than that of other fans which will be described later. For instance, the first fan (130) may be a sirocco fan, and the second fan (132) may be a crossing fan. The heat exchanger (140) is sealed by being combined with the first case (120) by a sealing unit (144). The sealing unit (144) may be made from materials with good sealing characteristics such as silicon resin and sponge.

The second space has a relatively high internal temperature due to the compressor (123) and the condenser (124). This hot air may be discharged to the outside of the first system (100) through a duct (126) by a third fan (125). The second space may have other devices added, which are not shown in the drawings, such as an expansion valve, a water tank which stores water generated in the compressor (123) and the condenser (124), and an inflow path through which cold air in the outside flows in.

According to FIG. 3, on the first partition wall (121) placed are the heat exchanger (140) and the evaporator (150) by being distanced from each other for a certain distance (D). If there is no such distance (D), cooling performance may be lowered due to a difference in a cooling mechanism between the heat exchanger (140) and the evaporator (150). The distance (D) may be properly adjusted by considering the size, cooling ability, etc. of the heat exchanger (140) and the evaporator (150). The first case (120) is connected to the first case (120) by a second partition wall (127). The first case (120) has a vent hole (135), and the external air is oriented to the heat exchanger (140) by being sucked up by a fourth fan (134). The air, which has passed through the heat exchanger (140), is discharged to the outside by the fourth fan (134). That is, the fourth fan (134) is placed on both sides of the heat exchanger (140) to suck up and discharge the external air.

The heat exchanger (140) comprises: a plurality of radiation fins (141) which are distanced from each other for a certain distance; and a plurality of heat exchange pipes (142) which are placed vertically to the radiation fins (141). This will be more specifically described by referring to FIG. 4 and FIG. 5. The air sucked up from the cooling zone (CZ) flows into the spaces between the radiation fins (141) and is oriented to the evaporator (150) after heat is exchanged by the heat exchange pipes (142) in which the external air flows. The degree, to which heat is exchanged in the heat exchange pipes (142), may be checked by a temperature sensor (145) which is installed on the entrance of the heat exchanger (140) and another temperature sensor (146) which is installed on the exit of the heat exchanger (140). The radiation fins (141) and the heat exchange pipes (142) of the present invention are made from metal with a good thermal conductivity. For instance, the radiation fins (141) may be made from aluminum (Al), and the heat exchange pipes (142) may be made from copper (Cu).

In the inside of the heat exchange pipes (142) moved is the external air, which is colder than the air in the cooling zone (CZ), by the fourth fan (134) which is installed in the space between the second partition wall (127) and the first case (120). The external air, which passes through the fourth fan (134), enters and exits through the vent hole (135). The size and the number of the radiation fins (141) and the heat exchange pipes (142) may be determined by considering the size of the heat exchanger (140) and the degree of heat exchange of the present invention. Corresponding to that, the number of the fourth fan (134) and the vent hole (135) may be determined also. Meanwhile, the heat exchanger (140) may have a variety of shapes other than those shown. For instance, the heat exchanger (140) may have a waveform structure in which the radiation fins (141) and the heat exchange pipes (142) are bonded by crossing each other in zigzags, or a structure in which the radiation fins (141) and the heat exchange pipes (142) cross each other at a variety of angle.

The evaporator (150) is a device into which a refrigerant at a low temperature and a low pressure, which has passed through the expansion valve, flows, and which absorbs heat by liquid evaporation. The evaporator (150) exchanges heat with the surrounding space or an object to be cooled. The evaporator (150) may have a variety of shapes, and here the evaporator (150) is briefly expressed in a shape in which the refrigerant flows in a coil-shaped pipe. The evaporator (150) may have not a single unit but a plurality of units. For instance, as shown, a first evaporator unit (151a) and a second evaporator unit (151b) may be installed. The number of the evaporator units may be different according to the size of the evaporator (150), the desired cooling degree, etc.

Figure 4:
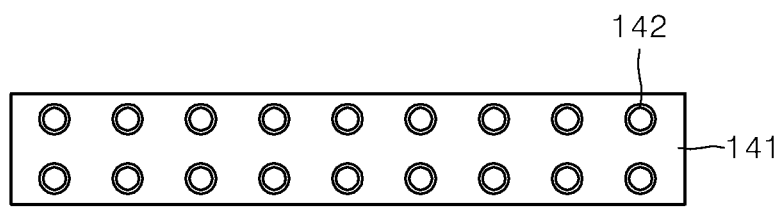
FIG. 4 is a side view which describes the heat exchanger of FIG. 2.
Figure 5:
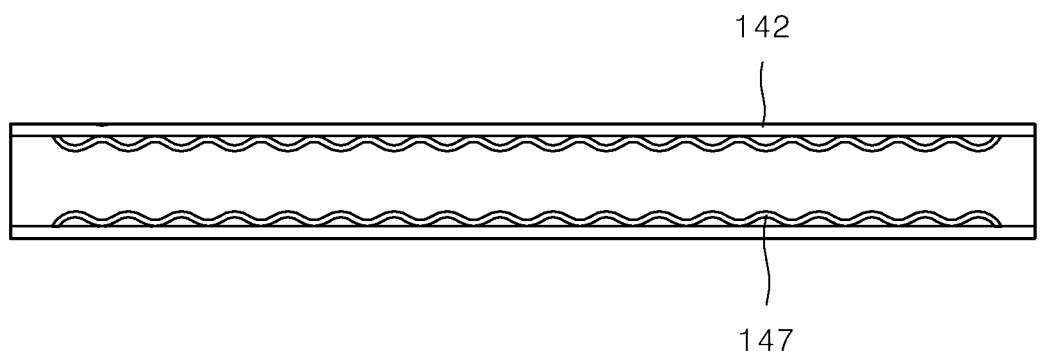
FIG. 5 is a cross-sectional drawing which expresses a case of the heat exchange pipe which composes the heat exchanger of FIG. 2.
Figure 6:
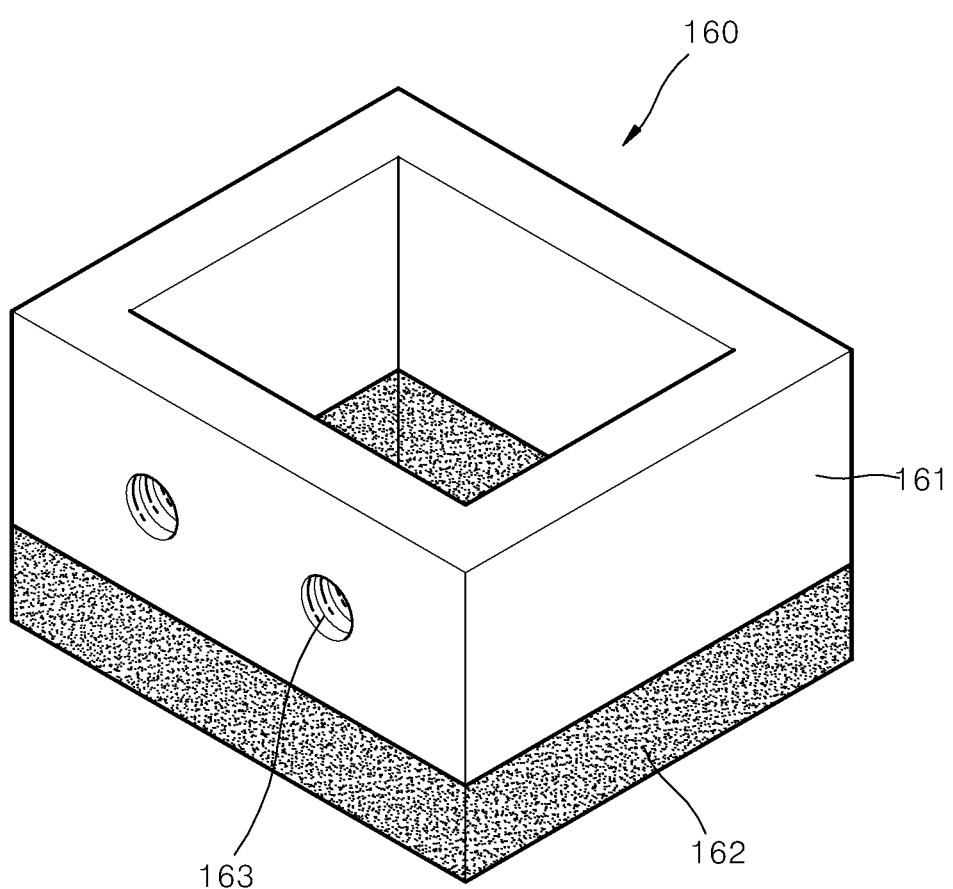
FIG. 6 is a perspective view which describes the suction connection unit of FIG. 2.

FIG. 4 is a side view which describes the heat exchanger (140) of FIG. 2, and FIG. 5 is a cross-sectional drawing which expresses a case of the heat exchanger pipes (142) which compose the heat exchanger (140) of FIG. 2. FIG. 6 is a perspective view which describes the suction connection unit (160) of FIG. 2.

Referring to FIG. 4 and FIG. 5, the radiation fins (141) are in a shape in which a plurality of plates are vertical to the second partition wall (127). The plates are desirable to be rectangular parallelepiped. The number of the radiation fins (141) and the distance between the radiation fins (141) may be determined by considering the size, the cooling efficiency, etc. of the first system (100). The radiation fins (141) may be extended straight or may make the shape of a wave while maintaining the distance. When the radiation fins (141) make a the shape of a wave, the flow of the internal air, which has flown in from the cooling zone (CZ), becomes slower, and the contact area between the radiation fins (141) and the heat exchange pipes (142) may be increased to improve heat exchange efficiency. The shape of a wave may be various such as a square wave form and a triangular wave form.

The heat exchange pipes (142) penetrate a penetrating hole (not shown) formed inside the radiation fins (141), and are physically in contact with the radiation fins (141). The physically contacting methods may vary. For instance, a plastic deformation of the heat exchange pipes (142) may be caused by letting a sphere, whose diameter is greater than the diameter of the heat exchange pipes (142), pass through the inside of the heat exchange pipes (142). By the plastic deformation, the heat exchange pipes (142) come in contact with the radiation fins (141). The contact is to let the heat included in the heated internal air in the cooling zone (CZ), which moves to the distance between the radiation fins (141), be easily transferred to the heat exchange pipes (142). The drawings show the heat exchange pipes (142) made in two rows. As the case may be, more heat exchange pipes (142) may be placed by forming more penetrating holes, into which the heat exchange pipes (142) are inserted, in the central part of the radiation fins (141).

In the flow path inside the heat exchange pipes (142) flows the external air, which is colder than the hot internal air in the cooling zone (CZ). In order to properly adjust the speed at which the external air flows, the heat exchange pipes (142) may be transformed by a variety of methods. For instance, the velocity of flow may be reduced by forming a curved unit (147) in the heat exchange pipes (142), and the speed, at which the external air flows, may be reduced by forming a zigzag shape of the heat exchange pipes (142). The curved unit (147) and the heat exchange pipes (142) in the shape of a wave may increase heat exchange efficiency by slowing the flow of the external air, which has flown in, and increasing the contact area between the heat exchange pipes (142) and the radiation fins (141). The curved unit (147) and the shape of a wave may be set to be diverse such as a square wave form and a triangular wave form.

According to FIG. 6, the suction connection unit (160) comprises: a body (161); and a packing (162). The suction connection unit (160) is inserted into the suction tanks (170) and is fixated on the suction tanks (170) by using a tightening bolt (164 of FIG. 2). The packing (162) is made from elastic materials such as rubber, and the packing (162) comes in contact with the first case (120). The body (161) of the suction connection unit comprises a fastening unit (163) with which the tightening bolt (164 of FIG. 2) is fastened from outside the suction tanks (170). The fastening unit (163) is in the shape of a screw, and has a margin for the tightening bolt (164) to be fastened while moving. That is, when the tightening bolt (164) is fixated on the fastening unit (163) for the packing (162) to completely come in contact with the first case (120), the fixation of the suction connection unit (160) is completed. Here, the body (161) and the packing (162) form a first penetrating hole (131).

Figure 7:
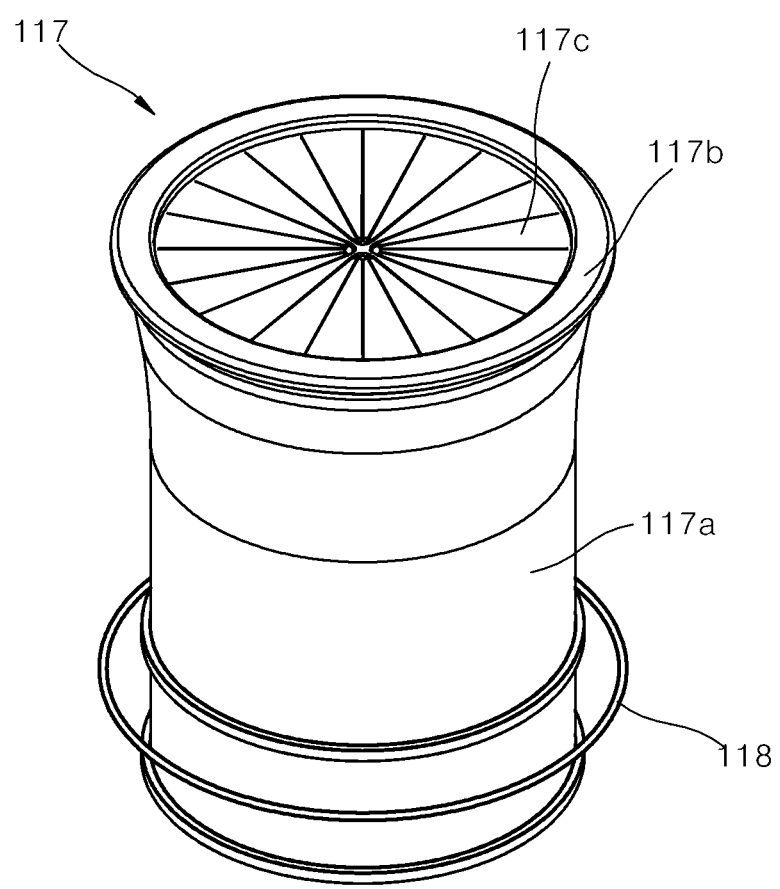
FIG. 7 is a perspective view which describes the cable bin of FIG. 2.
Figure 8:
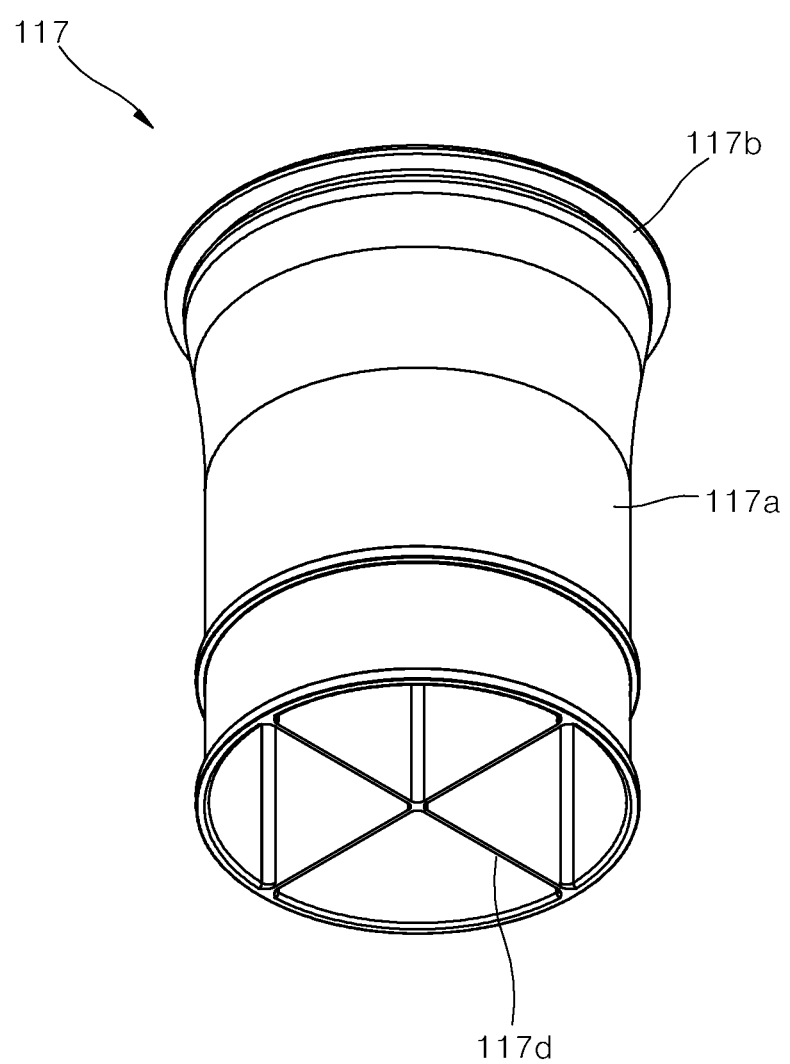
FIG. 8 is a perspective view which describes the cable bin of FIG. 2.

FIG. 7 and FIG. 8 are perspective views which describe the cable bin (117) which is applied to the first rack mount server system (100) according to the enablement of the present invention.

According to FIG. 7 and FIG. 8, the cable bin (117) comprises: a body (117a); and a cover (117b) on one side of the body (117a). The cover (117b) comprises a plurality of pieces (117c). On the other side formed are a plurality of cable insertion holes (117d) into which a cable is inserted. The cable may be put into the cooling zone (CZ) by being put into the cable insertion holes (117d) and letting the cable pass through a space from which the pieces (117c) are bent back or detached. The cable includes a power line, communication line, and a variety of signal lines. Thus, proper cable insertion holes (117d) may be selected in accordance with the characteristics of the cable. When the body (117a) is tied with a cable tie (118) after storing the cable in the cable bin (117), the cable bin (117) is sealed. The cable bin (117) is desirable to be made from high polymer materials such as rubber resin and silicon resin, which are soft with good sealing quality.

Figure 9:
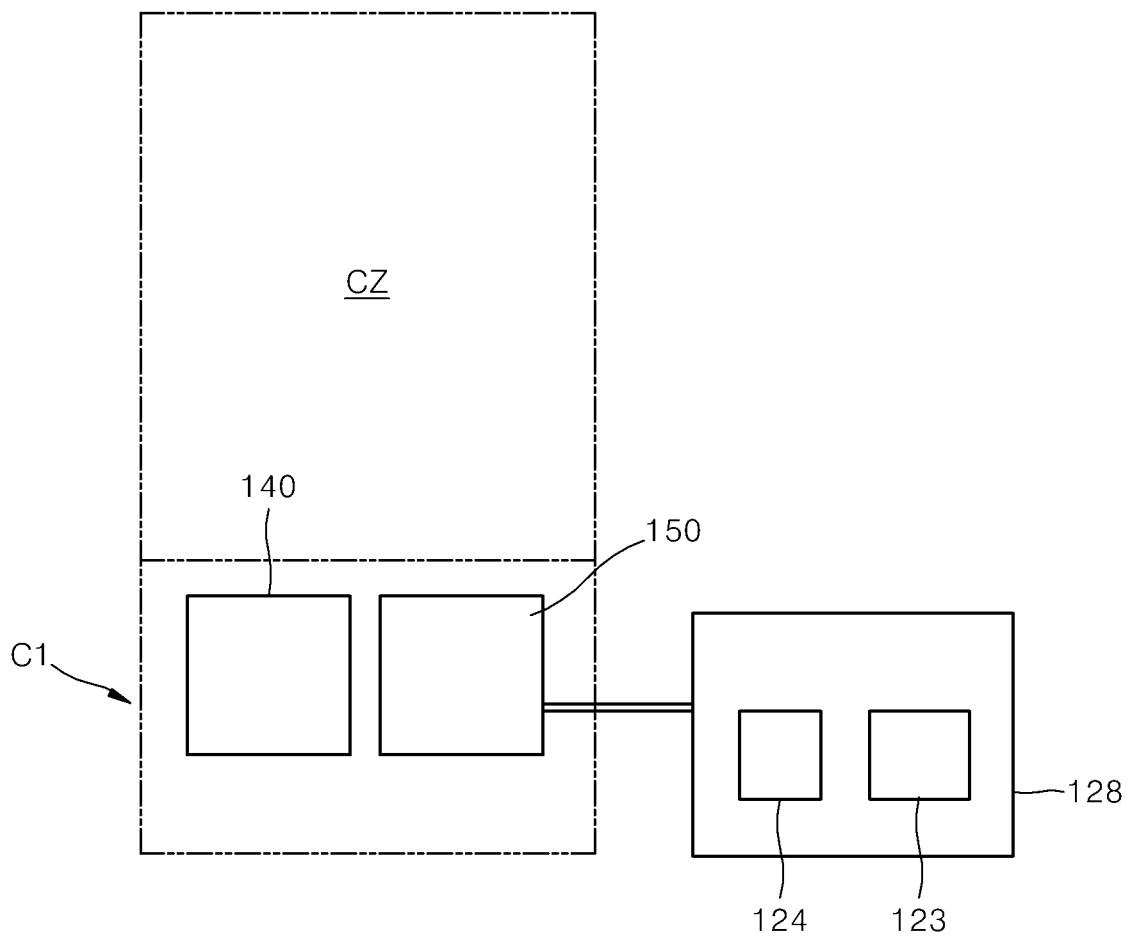
FIG. 9 is a drawing which briefly shows an alternative enablement of the first rack mount server system according to the present invention.

FIG. 9 is a drawing which briefly shows an alternative enablement of the first rack mount server system (100) according to the enablement of the present invention. For convenience in description, the other parts than the parts, which make the characteristics of the alternative enablement, are omitted.

According to FIG. 9, an alternative enablement of the first system (100) is the same as the first system (100) described above, excluding the fact that an outdoor unit (128), which comprises: a compressor (123); a condenser (124); and other devices (an expansion valve, etc.), is installed outside the rack housing (110 of FIG. 1). The heat exchanger (140) and the evaporator (150) are placed in the rack housing (110). By installing the outdoor unit (128) outside the rack housing (110), the space occupied by the first cooling structure (C1) may be reduced and the impact of the heat generated in the compressor (123), the condenser (124), etc. on the first cooling structure (C1) may be reduced. Accordingly, a rack mount server system with the first system (100) transformed may increase cooling effects of the cooling zone (CZ).

Figure 10:
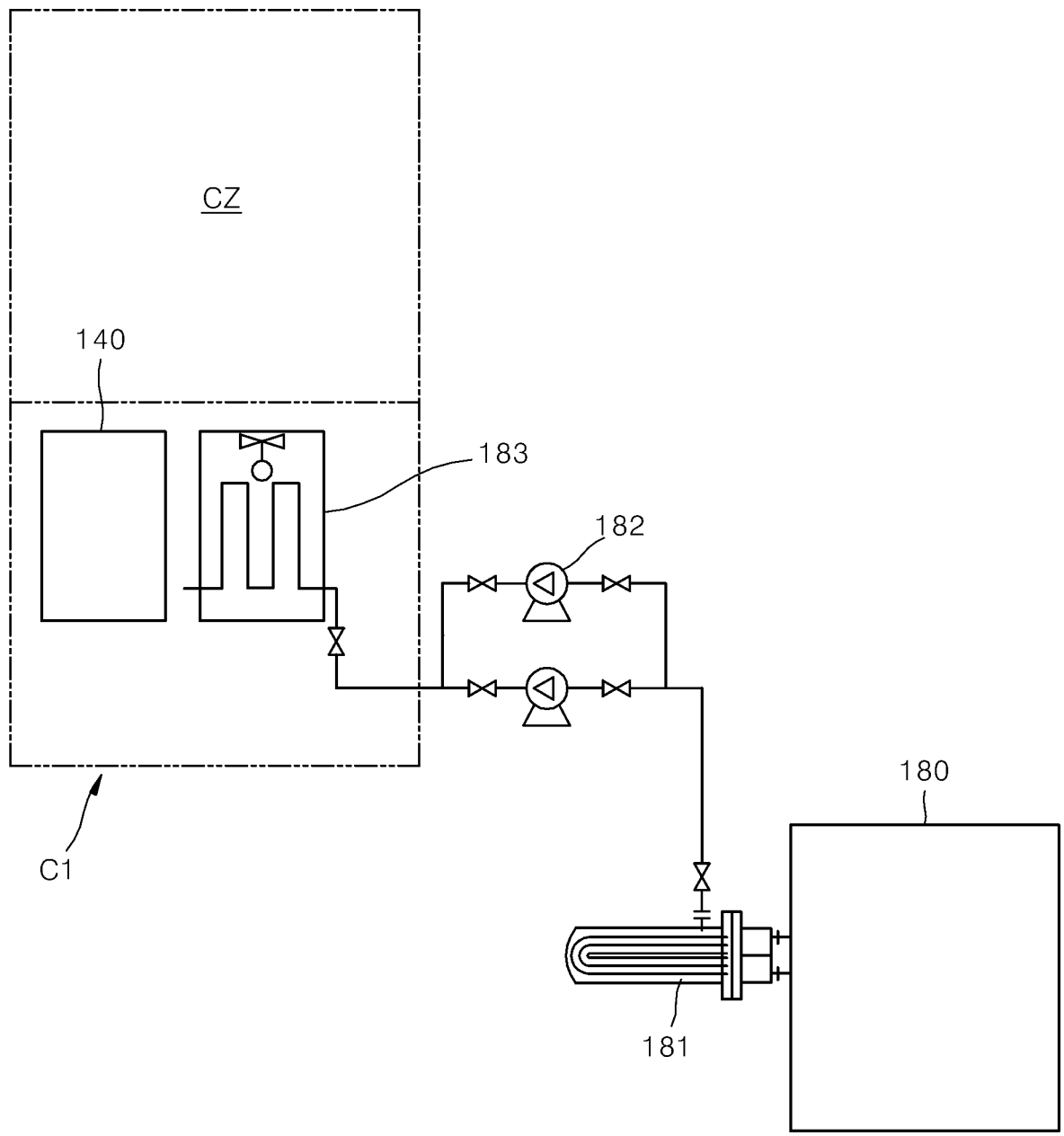
FIG. 10 is a drawing which briefly shows another alternative enablement of first rack mount server system according to the present invention.

FIG. 10 is a drawing which briefly shows another alternative enablement of the first rack mount server system (100) according to the enablement of the present invention. For convenience in description, the other parts than the parts, which make the characteristics of the alternative enablement, are omitted.

According to FIG. 10, another enablement of the first system (100) applies a chiller. An outdoor unit (180), which comprises: a compressor; and a condenser, a chiller evaporator (181), and a circulation pump (182), which compose the chiller, are the same as the first system (100) described above, excluding the fact that they are installed outside the rack housing (110 of FIG. 1). The heat exchanger (140) and a refrigerant flow path (183) are placed in the rack housing (110). The refrigerant flow path (183) performs the same function and plays the same role as those of the evaporator (150) in the first system (100). By installing the other components than the refrigerant flow path (183) outside the rack housing (110), the space occupied by the first cooling structure (C1) may be reduced, and the impact of the heat generated in the compressor, the condenser, etc. on the first cooling structure (C1) may be reduced. Accordingly, the other rack mount server system with a transformed first system (100) may increase cooling effects of the cooling zone (CZ).

Figure 11:
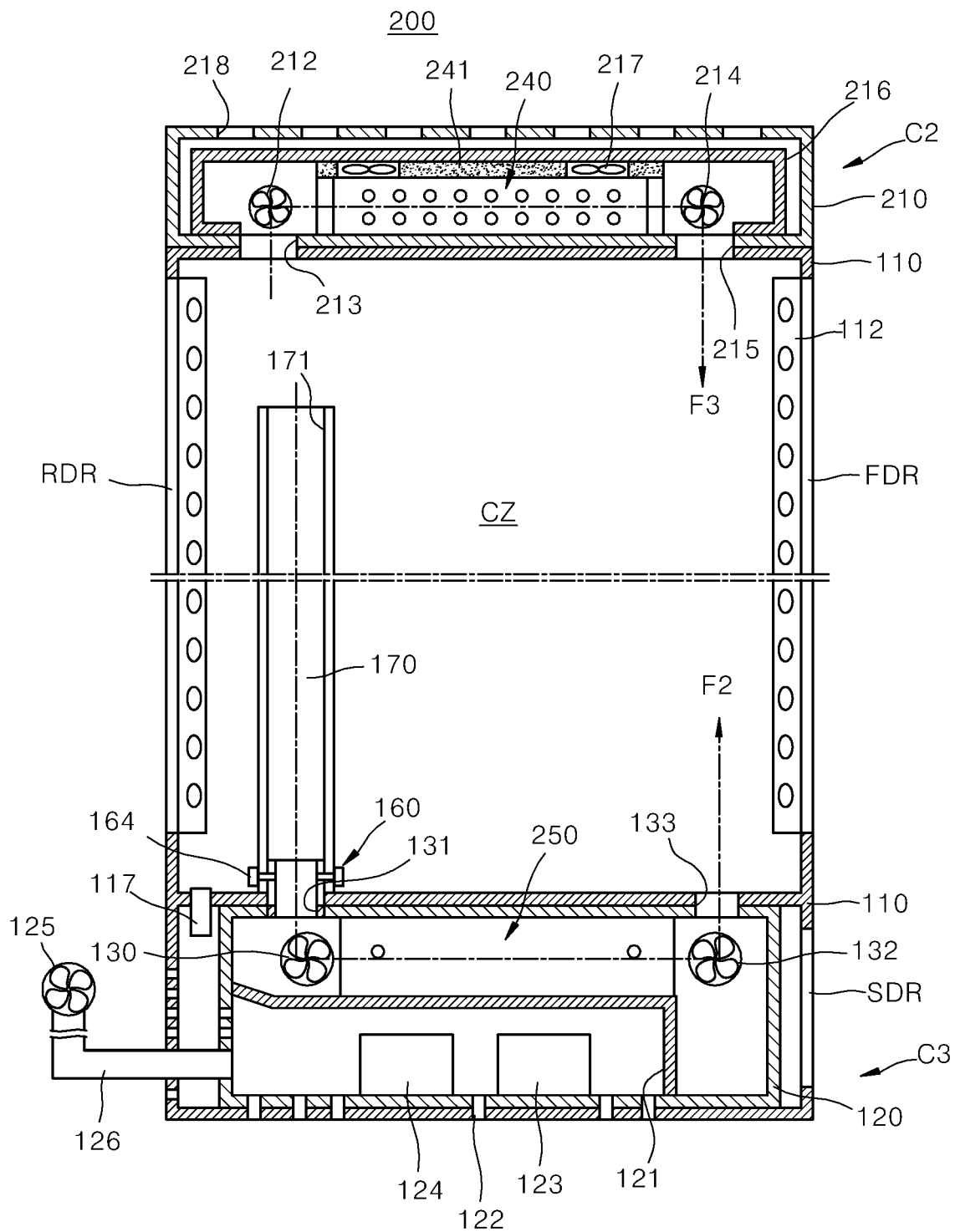
FIG. 11 is a cross-sectional drawing which describes a second rack mount server system according to the present invention.

FIG. 11 is a cross-sectional drawing which describes a second rack mount server system (200) according to another enablement of the present invention. The second system (200) is the same as the first system (100), excluding the fact that the heat exchanger (140) and the evaporator (150) of the first system (100) are respectively placed on the top and the bottom of the rack housing (110). Accordingly, detailed description on the same reference marks is omitted.

According to FIG. 11, the second system (200) has a heat exchanger (240) placed on the top of the rack housing (110) and an evaporator (250) placed on the bottom of the rack housing (110). The heat exchanger (240) and the evaporator (250) have the same functions and roles as those of the heat exchanger (140) and the evaporator (150) of the first system (100), but, their size and shape may be different to fit the second system (200). If the first system and the second system (100, 200) have the rack housing (110) of the same size, the size and shape of the heat exchanger (240) and the evaporator (250) may be increased. The heat exchanger (240) is combined with a third case (216) by a sealing unit (241) and is sealed. The sealing unit (241) may be made from materials with good sealing characteristics such as silicone resin and sponge. The part in which the heat exchanger (240) is installed on the second system (200) may be defined as a second cooling structure (C2), and the part where the evaporator (250) is installed on the second system (200) may be defined as a third cooling structure (C3). The third cooling structure (C3) is accommodated in the first case (120), and the second cooling structure (C2) is accommodated in a second case (210). The heat exchanger (240) is built in a third case (216), and the evaporator (250) is built in the first case (120).

Into the first fan (130) flows the air in the cooling zone (CZ) which is inserted into the suction tanks (170) through the first penetrating hole (131), and the second fan (132) sends the air, which has passed through the evaporator (250), to the cooling zone (CZ) through the second penetrating hole (133). The first penetrating hole (131) sucks up the air from the cooling zone (CZ), and the second penetrating hole (133) discharges the air to the cooling zone (CZ). The air flow following this process is displayed as F2. Similarly, a fifth fan (212) lets the air in the cooling zone (CZ) be sucked up to the second cooling structure (C2) through a third penetrating hole (213), and a sixth fan (214) sends the air, which has passed through the heat exchanger (240), to the cooling zone (CZ) through a fourth penetrating hole (215). The third penetrating hole (213) sucks up the air from the cooling zone (CZ), and the fourth penetrating hole (215) discharges the air to the cooling zone (CZ). The air flow following this process is displayed as F3.

The heat exchanger (240) is blocked from the external air by the third case (216). The external air enters and exits by a seventh fan (217) by passing through a vent hole (218) formed on the top of the second case (210). Though not shown, more fans are installed in between the second case and the third case (210, 216) to control the flow of the external air. According to the enablement of the present invention, the second system (200) has the heat exchanger (240) and the evaporator (250), which are separated from each other, and the capacity of the heat exchanger (240) and the evaporator (250) may be greater than that in the first system (100). In addition, the outdoor unit and the chiller described in the first system (100) may also be applied to the second system (200).

Figure 12:
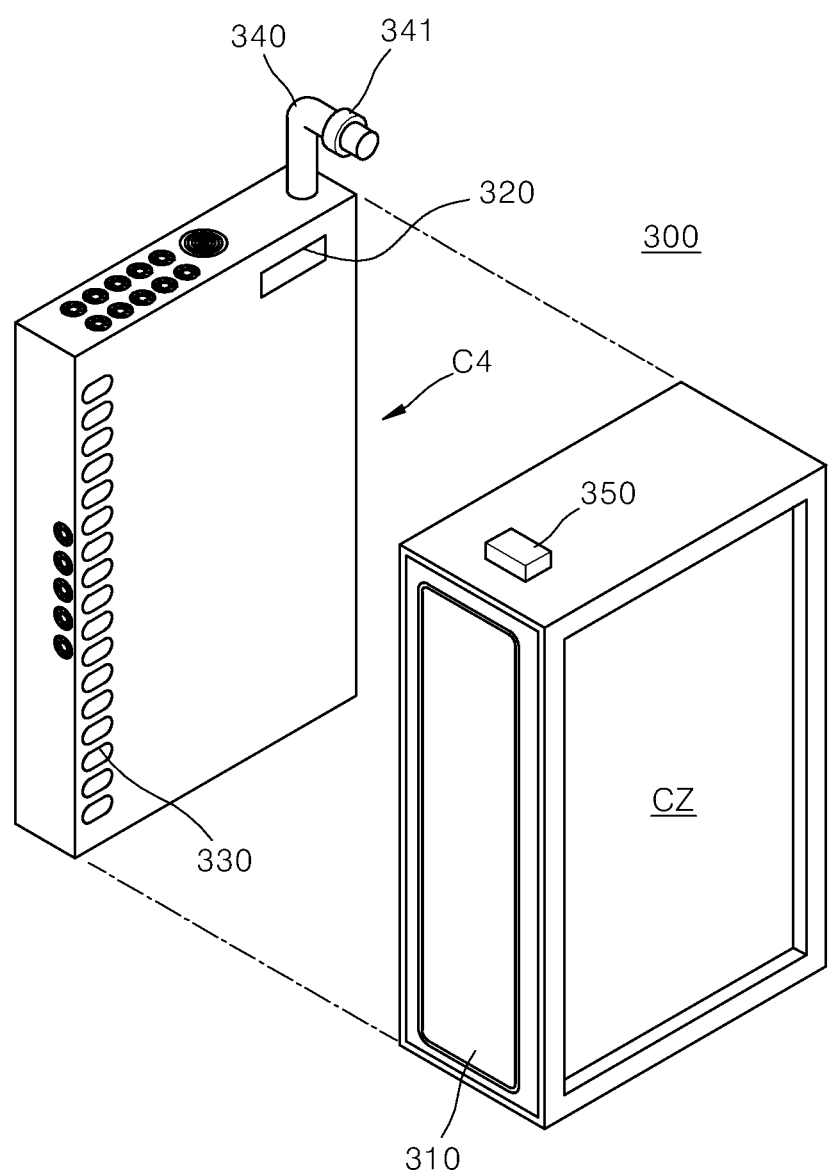
FIG. 12 is a brief exploded perspective view which describes a third rack mount server system according to the present invention.
Figure 13:
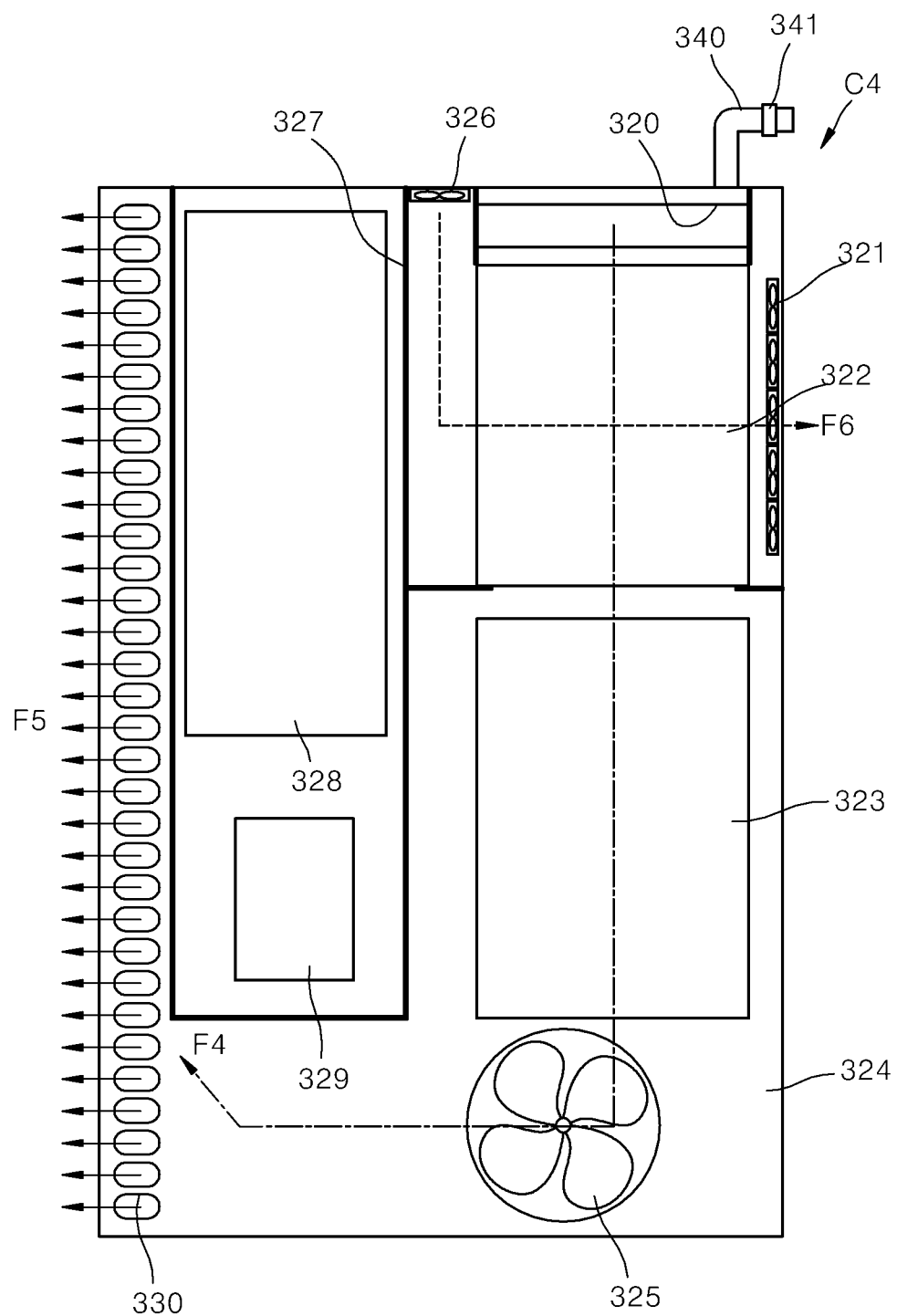
FIG. 13 is a ground plan which shows the fourth cooling structure of FIG. 12.
Figure 14:
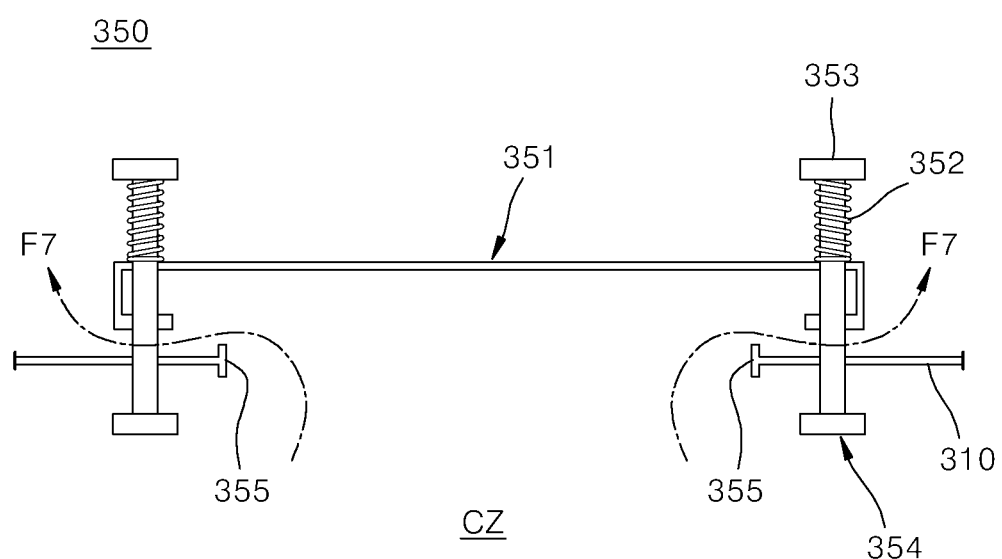
FIG. 14 is a drawing which briefly shows the relief damper of FIG. 12.

FIG. 12 is a brief exploded perspective view which describes a third rack mount server system (300) according to another enablement of the present invention. FIG. 13 is a ground plan which shows a fourth cooling structure (C4) of the third system (300). FIG. 14 is a drawing which briefly shows a relief damper (350) which controls the air pressure in the cooling zone (CZ), by using the duct (340) in FIG. 12. The third system (300) is the same as the first system (100), excluding the fact that the fourth cooling structure (C4) is placed on a side surface of the rack housing. For convenience in description, the other parts than those parts, which make the characteristics of the third system (300), are omitted.

According to FIG. 12 to FIG. 14, the third system (300) has the fourth cooling structure (C4) attached to one side of a rack housing (310). The fourth cooling structure (C4) sucks up the air in the cooling zone (CZ) in the rack housing (310), cools the air by the heat exchanger and the evaporator, which are described above, and sends the air to the cooling zone (CZ). The air in the cooling zone (CZ) is sucked from a fifth penetrating hole (320), and the air in the fourth cooling structure (C4) is discharged to the cooling zone (CZ) through a sixth penetrating hole (330). Refer to the first system (100) for the functions and roles of the fourth cooling structure (C4). The third system (300) of the present invention has the fourth cooling structure (C4) attached to a side surface of the rack housing (310), and the size of the cooling zone (CZ) may be increased. In the rack housing (310) placed is a passage which is connected to the fifth penetrating hole and the sixth penetrating hole (320, 330) of the fourth cooling structure (C4). In addition, a multiple rack mount server system, which will be described later, may be composed.

The fourth cooling structure (C4) has elements for cooling, which are installed in a cooling structure body (324). The air in the cooling zone (CZ) is sucked up from the fifth penetrating hole (320), and the air in the fourth cooling structure (C4) is discharged to the cooling zone (CZ) through the sixth penetrating hole (330). The air flow following this process is displayed respectively as F4 and F5. The suction from the fifth penetrating hole (320) is done by a ninth fan (325), and the discharge through the sixth penetrating hole (330) is done by the ninth fan (325). The sixth penetrating hole (330) is desirable to be formed in plural numbers evenly on the whole body (324) in a longitudinal direction in order to let the air cooled by the fourth cooling structure (C4) be evenly discharged to the cooling zone (CZ).

In between the fifth penetrating hole (320) and the ninth fan (325) successively placed are a heat exchanger (322) and an evaporator (323), which are described in the first system (100). The heat exchanger (322) may exchange heat by heat exchange pipes, in which the external air flows, by using an eighth fan (326) and a tenth fan (321). Here, the flow of the external air is displayed as F6. The heat exchanger (322) and the evaporator (323) have the same functions and roles as those of the heat exchanger (140) and the evaporator (150) of the first system (100), but, their size and shape may be different to fit the third rack mount server system (300). Here, a compressor (329) and a condenser (328), which perform the same functions and play the same roles as those for the compressor (123) and the condenser (124) in the first system (100), are separated by a third partition wall (327).

Meanwhile, the fourth cooling structure (C4) may further comprise a duct (340), which is able to let the external air flow in, near the fifth penetrating hole (320). For instance, in winter with low temperatures, cold external air may be used for cooling the cooling zone (CZ). The inflow of the external air through the duct (340) may be controlled by a duct opening/closing unit (341). For instance, in summer with high temperatures, the inflow of the external air may be blocked by closing the duct opening/closing unit (341). The external air, which is let flow in by the duct (340), flows into the cooling zone (CZ) by passing through the fourth cooling structure (C4). But, when the external air, which is let flow into the cooling zone (CZ), is increased, the air pressure in the cooling zone (CZ) is increased. When the air pressure is excessively increased, a negative impact may be given on the rack mount server system. Here, the duct (340) may further comprise a filter for purifying the air, a fan for letting air flow in, etc.

Referring to FIG. 14, a relief damper (350) is installed as an example for controlling the air pressure in the cooling zone (CZ). Of course, within the scope of the present invention, the presented relief damper (350) may be substituted by another shape of pressure control means. The relief damper (350) comprises a sealing unit (351) which comes in contact with a seventh penetrating hole (244) which is formed on the rack housing (310). The sealing unit (531), which comes in contact with the rack housing (310), may comprise a separate gasket. The sealing unit (351) makes a reciprocating motion by elastic force of an elastic body (352) which is mounted on a guide (353). The movement of the sealing unit (351) by elastic force is blocked by a stopper (354) which is placed inside the rack housing (310) and which is attached to the guide (353). When the pressure in the cooling zone (CZ) is increased, the sealing unit (351) is pushed to leak the internal air through the seventh penetrating hole (355). When the pressure in the cooling zone (CZ) returns to a normal status, the sealing unit (351) is returned to the original position by elastic force of the elastic body (352), and seals the seventh penetrating hole (355). The air flow following this process is displayed as F7.

Figure 15:
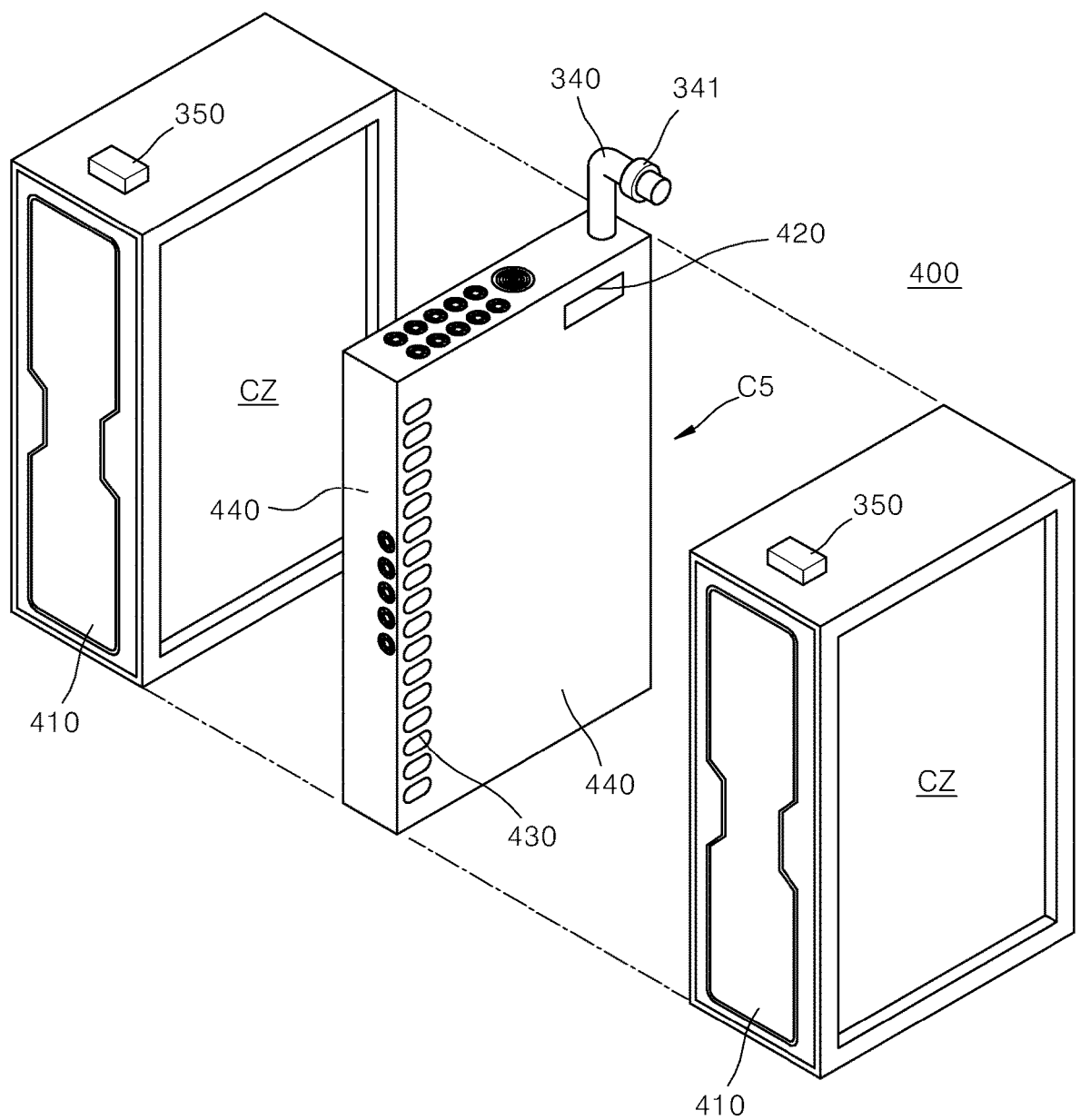
FIG. 15 is a brief exploded perspective view which describes a fourth rack mount server system according to the present invention.

FIG. 15 is a brief exploded perspective view which describes a fourth rack mount server system (400) according to another enablement of the present invention. The fourth system (400) is the same as the third system (300), excluding the fact that the cooling structure of the third system (300) is transformed and is applied to a multiple rack mount server system. For convenience in description, the other parts than the parts, which make the characteristics of the fourth system (400), are omitted.

Referring FIG. 15, the fourth system (400) may realize a multiple rack mount server system by n (a whole number) units of fifth cooling structures (C5). Here, multiple means there are (n+1) units of rack housings (410). Like the third system (300), the fourth system (400) has an increased size of cooling zone (CZ), and may combine a greater number of rack housings (410) than that in the third system (300). A fifth cooling structure (C5) has elements for cooling installed, as described in the fourth cooling structure (C4). An eighth penetrating hole and a ninth penetrating hole (420, 430), which play the role of the fifth penetrating hole and the sixth penetrating hole (320, 330) in the fourth cooling structure (C4), are formed on both side surfaces (440) of the fifth cooling structure (C5).

The first to fourth systems (100, 200, 300, 400) of the present invention may use different cooling methods in accordance with the internal temperature ($T_{in}$) in the cooling zone (CZ) and the external temperature ($T_{out}$) outside the cooling zone (CZ). Here, refer to the first system (100) for the server system for the cooling methods. Here, the cooling methods are to control the operation of the heat exchanger (140).

When the external temperature ($T_{out}$) is higher than the internal temperature ($T_{in}$), the efficiency of the heat exchanger (140) is lowered. To prevent this, the operation of the fourth fan (134), which lets the external air flow into the heat exchanger (140) of the first cooling structure (C1), is stopped. This is to prevent the air having a high external temperature ($T_{out}$) from flowing into the cooling zone (CZ). If, the external temperature ($T_{out}$) is lower than the internal temperature ($T_{in}$), the operation of the first cooling structure (C1) is activated by the following method.

First, when the internal temperature ($T_{in}$) is higher than a threshold temperature (T1) and lower than another threshold temperature (T2), only the heat exchanger (140) of the first cooling structure (C1) is operated. Here, the threshold temperature (T1) is a temperature at which the first cooling structure (C1) is not needed to operate, and the other threshold temperature (T2) is a limit temperature for operating only the heat exchanger (140). The threshold temperature (T1) is desirable to be 20° C., and the other threshold temperature (T2) is desirable to be 25° C. For instance, if the internal temperature ($T_{in}$) is 20° C., the cooling zone (CZ) can be sufficiently cooled with only the operation of the heat exchanger (140). Substantially, the power consumed by the heat exchanger (140) to lower the temperature by 1° C. in the temperature range is about half the power consumed by the evaporator (150). Accordingly, if cooling is done by only the heat exchanger (140), the power consumption can be lowered. Here, it is clear that the external temperature ($T_{out}$) is lower than the internal temperature ($T_{in}$) of when the heat exchanger (140) operates.

Second, when the internal temperature ($T_{in}$) is the same as or higher than the threshold temperature (T2) and is lower than another threshold temperature (T3), the first cooling structure (C1) performs a primary cooling by the heat exchanger (140) and performs a secondary cooling by the evaporator (150). Here, the threshold temperature (T3) is a limit temperature to sufficiently cool the cooling zone (CZ) by the heat exchanger (140) and the evaporator (150) of the present invention. The threshold temperature (T3) is, for instance, desirable to be 32° C. If successive cooling is done by the heat exchanger (140) and the evaporator (150), the air sucked up from the cooling zone (CZ) can be more efficiently cooled. Substantially, the power consumed by the heat exchanger (140) to lower the temperature by 1° C. within the temperature range is about half the power consumed by the evaporator (150). Accordingly, if the primary cooling and the secondary cooling are done, the power consumption can be lowered. Here, the external temperature ($T_{out}$) is lower than the internal temperature ($T_{in}$) of when the heat exchanger (140) and the evaporator (150) operate.

Third, when the internal temperature ($T_{in}$) is higher than the threshold temperature (T3), the front door and the rear door (FDR, RDR) of the first system (100) of the present invention are opened. The internal temperature ($T_{in}$) is higher than the threshold temperature (T3) when there is a problem in normal operation of the rack mount server system or there is a disorder in the first cooling structure (C1). In such a status, it is desirable to open the doors (FDR, RDR) and to rapidly lower the temperature of the cooling zone (CZ). Desirably, a user may stop the operation of the heat exchanger (140) of the first cooling structure (C1) and operate only the evaporator (140) simultaneously with opening the doors (FDR, RDR). Here, the external temperature ($T_{out}$) is lower than the internal temperature ($T_{in}$) of when the doors (FDR, RDR) are opened.

The threshold temperatures of T1 to T3 may be set differently according to the usage and environment for using the rack mount server system of the present invention, the cooling ability of the cooling structure, etc. The threshold temperatures of T1 to T3 presented above are just examples.

However, in accordance with the degree of increase in the internal temperature, the primary cooling is done by the heat exchanger, and the secondary cooling is conducted by the evaporator or by the combination of the heat exchanger and the evaporator. Accordingly, power consumption can be reduced and cooling efficiency can be optimized to meet the circumstances by controlling the primary cooling and the secondary cooling in accordance with a threshold temperature.

Above provided is a detailed description of the present invention with a desirable enablement of the present invention. However, the present invention is not limited to the enablement, and may be transformed diversely by a person with ordinary skill in the art to which the present invention pertains. For instance, the first to the fifth cooling structures are described as being placed on the top, the bottom, or a side surface of the cooling zone, but the cooling structures may be installed on one or more places of the top, the bottom, and a side surface. That is, the first cooling structure may be installed on the bottom of the cooling structure with the fifth cooling structure installed on a side surface of the cooling structure.

DESCRIPTION OF REFERENCE CHARACTERS

100, 200, 300, 400: The first to the fourth rack mount server systems
110, 310, 410; Rack housing
112; Mount rack
113a, 113b; Lock unit
114; Door sensor
115; Open unit
117; Cable bin
118; Cable tie
120, 210, 216; The first to the third cases
121, 127, 327; The first to the third barrier ribs
111, 122, 135, 218; Vent hole
126, 340; Duct
130, 132, 125, 134, 212, 214, 217, 326, 325, 321; The first to the tenth fans
131, 133, 213, 215, 320, 330, 355, 420, 430; The first to the ninth penetrating holes
140, 240, 322; Heat exchanger
141; Radiation fin
142; Heat exchange pipe
144; Sealing unit
150, 250, 323; Evaporator
160; Suction connection unit
170; Suction tank
180; Chiller outdoor unit
341; Duct opening/closing unit
350; Relief damper
C1, C2, C3, C4, C5; The first to the fifth cooling structures
CZ; Cooling zone

The invention claimed is:
1. A rack mount server system, comprising:
a rack housing;
a cooling zone which is placed inside the rack housing and forcibly cooled, the cooling zone storing a server; and
a cooling structure spatially separated from the cooling zone, the cooling structure including a heat exchanger and an evaporator spaced apart from the heat exchanger, wherein the cooling structure is configured to operate at least one of the heat exchanger and the evaporator according to a temperature inside the cooling zone and a temperature outside the rack housing, wherein the heat exchanger includes a heat exchange pipe, inside of which a first air flows from outside of the rack housing and outside of which a second air flows from inside of the cooling zone, and the heat exchanger is configured to operate when the first air has a temperature lower than that of the second air, and wherein, independently from the heat exchanger, the evaporator receives a refrigerant via a condenser and a compressor and exchanges heat by liquid evaporation, the condenser and the compressor being spatially separated from the evaporator and the heat exchanger by a partition wall.

2. The rack mount server system of claim 1, wherein the heat exchanger and the evaporator are successively placed in one or more places of a top surface, a bottom surface, and a side surface of the cooling zone.

3. The rack mount server system of claim 1, wherein the heat exchanger and the evaporator are placed on a top and a bottom of the cooling zone, respectively.

4. The rack mount server system of claim 1, wherein the evaporator comprises one or more evaporator units.

5. The rack mount server system of claim 1, wherein the rack housing comprises: a front door and a rear door which open or close the cooling zone; and the front door and the rear door are sealed by a gasket.

6. The rack mount server system of claim 1, wherein the rack housing comprises a door sensor which, when one or more of a front door and a rear door of the rack housing are opened, stops operation of the evaporator.

7. The rack mount server system of claim 1, wherein the rack housing comprises a tank-shaped suction tank which sucks up the second air in the cooling zone.

8. The rack mount server system of claim 7, wherein a suction connection unit with a packing is inserted into the suction tank.

9. The rack mount server system of claim 1, wherein the rack housing comprises a cable bin which has a cable insertion hole to insert a cable into the cooling zone and to seal the cable.

10. The rack mount server system of claim 1, wherein the heat exchanger comprises: a plurality of radiation fins physically in contact with the heat exchange pipe.

11. The rack mount server system of claim 10, wherein the heat exchange pipe has a curved unit inside or is in a wave shape.

12. The rack mount server system of claim 10, wherein the radiation fins are extended straight or in a wave shape while keeping a certain distance between neighboring radiation fins.

13. The rack mount server system of claim 1, wherein the cooling structure comprises: n units (n is a whole number) of cooling structures; and the rack housing comprises: (n+1) units of rack housings which are combined with both sides of the cooling structures.

14. The rack mount server system of claim 13, wherein the server system has a duct for air attached to the cooling structures, and the rack housings have a pressure control means for controlling an external air pressure.

15. The rack mount server system of claim 13, wherein the cooling structures and the rack housings are detachable.

16. The rack mount server system of claim 1, wherein the compressor and the condenser are placed outside the rack housing.

17. The rack mount server system of claim 1, wherein the rack housing comprises: a front door and a rear door which open or close the cooling zone by a plunger, which operates electromagnetically by a signal according to an air temperature, or by an input of a password.

* * * * *